(12) United States Patent
Ito et al.

(10) Patent No.: US 8,021,910 B2
(45) Date of Patent: *Sep. 20, 2011

(54) METHOD FOR PRODUCING SINGLE CRYSTAL SILICON SOLAR CELL AND SINGLE CRYSTAL SILICON SOLAR CELL

(75) Inventors: Atsuo Ito, Gunma (JP); Shoji Akiyama, Gunma (JP); Makoto Kawai, Gunma (JP); Koichi Tanaka, Gunma (JP); Yuuji Tobisaka, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 536 days.

This patent is subject to a terminal disclaimer.

(21) Appl. No.: 11/907,902

(22) Filed: Oct. 18, 2007

(65) Prior Publication Data
US 2008/0099065 A1 May 1, 2008

(30) Foreign Application Priority Data
Oct. 30, 2006 (JP) .................... 2006-294605

(51) Int. Cl.
*H01L 21/00* (2006.01)
(52) U.S. Cl. .......... 438/73; 438/237; 438/455; 438/458; 438/528; 257/E21.002
(58) Field of Classification Search .............. 438/73, 438/237, 455, 458, 528
See application file for complete search history.

(56) References Cited

U.S. PATENT DOCUMENTS

| | | | |
|---|---|---|---|
| 4,427,839 A | 1/1984 | Hall | |
| 4,773,942 A | 9/1988 | Hamakawa et al. | |
| 4,927,770 A | 5/1990 | Swanson | |
| 5,374,564 A | 12/1994 | Bruel | |
| 5,646,432 A | 7/1997 | Iwaki et al. | |
| 5,665,607 A | 9/1997 | Kawama et al. | |
| 5,811,348 A | 9/1998 | Matsushita et al. | |
| 5,956,571 A | 9/1999 | Yang | |
| 5,972,732 A | 10/1999 | Gee et al. | |

(Continued)

FOREIGN PATENT DOCUMENTS
DE 199 36 941 A1 8/1999

(Continued)

OTHER PUBLICATIONS

Shah, A. V. et al., "Thin-film Silicon Solar Cell Technology." Progress in Photovoltaics: Research and Applications, vol. 12, No. 2-3, pp. 113-142, 2004.

(Continued)

*Primary Examiner* — Jack Chen
(74) *Attorney, Agent, or Firm* — Oliff & Berridge, PLC

(57) ABSTRACT

A method for producing a single crystal silicon solar cell including the steps of: implanting ions into a single crystal silicon substrate through an ion implanting surface thereof to form an ion implanted layer in the single crystal silicon substrate; forming a transparent electroconductive film on a surface of a transparent insulator substrate; conducting a surface activating treatment for the ion implanting surface of the single crystal silicon substrate and/or a surface of the transparent electroconductive film on the transparent insulator substrate; bonding the ion implanting surface of the single crystal silicon substrate and the surface of the transparent electroconductive film on the transparent insulator substrate to each other; applying an impact to the ion implanted layer; and forming a p-n junction in the single crystal silicon layer.

18 Claims, 1 Drawing Sheet

U.S. PATENT DOCUMENTS

| | | | |
|---|---|---|---|
| 5,985,742 | A | 11/1999 | Henley et al. |
| 6,013,563 | A | 1/2000 | Henley et al. |
| 6,048,411 | A | 4/2000 | Henley et al. |
| 6,331,208 | B1 | 12/2001 | Nishida et al. |
| 6,391,743 | B1 | 5/2002 | Iwane et al. |
| 6,555,443 | B1 | 4/2003 | Artmann et al. |
| 7,019,207 | B2 | 3/2006 | Harneit et al. |
| 2002/0011590 | A1 | 1/2002 | Nagashima |
| 2003/0203547 | A1 | 10/2003 | Sakaguchi |
| 2004/0009649 | A1 | 1/2004 | Kub et al. |
| 2004/0207485 | A1 | 10/2004 | Kawachi et al. |
| 2004/0229444 | A1 | 11/2004 | Couillard et al. |
| 2004/0248379 | A1 | 12/2004 | Maleville et al. |
| 2006/0169316 | A1 | 8/2006 | Thomsen et al. |
| 2008/0099066 | A1* | 5/2008 | Ito et al. ............ 136/261 |
| 2008/0099067 | A1* | 5/2008 | Ito et al. ............ 136/261 |
| 2008/0121275 | A1* | 5/2008 | Ito et al. ............ 136/255 |
| 2008/0121278 | A1* | 5/2008 | Ito et al. ............ 136/256 |
| 2008/0245408 | A1* | 10/2008 | Ito et al. ............ 136/255 |
| 2009/0007960 | A1* | 1/2009 | Ito et al. ............ 136/255 |

FOREIGN PATENT DOCUMENTS

| | | |
|---|---|---|
| DE | 199 36 941 A 1 | 5/2000 |
| EP | 0 971 396 A1 | 1/2000 |
| GB | 2 405 030 A | 2/2005 |
| JP | A-63-287077 | 11/1988 |
| JP | A-5-211128 | 8/1993 |
| JP | A-07-106617 | 4/1995 |
| JP | A-7-226528 | 8/1995 |
| JP | 08-213645 | 8/1996 |
| JP | A-08-213645 | 8/1996 |
| JP | A-9-331077 | 12/1997 |
| JP | A-10-93122 | 4/1998 |
| JP | A-11-004008 | 1/1999 |
| JP | A-2000-150940 | 5/2000 |
| JP | A-2001-111080 | 4/2001 |
| JP | A-2001-189477 | 7/2001 |
| JP | A-2001-217443 | 8/2001 |
| JP | A-2003-017723 | 1/2003 |
| JP | A-2004-304622 | 10/2004 |
| JP | A-2004-342909 | 12/2004 |
| JP | A-2006-295037 | 10/2006 |
| JP | A-2006-324530 | 11/2006 |
| WO | WO 98/52216 A1 | 11/1998 |
| WO | WO 01/75976 A1 | 10/2001 |
| WO | WO 03/058725 A1 | 7/2003 |
| WO | WO 2006/093817 | 9/2006 |
| WO | WO 2007/109568 A2 | 9/2007 |

OTHER PUBLICATIONS

Decision of Refusal for Patent Application No. 2006-294605; mailed Feb. 23, 2010 (with translation).
Kiyoshi Takahashi et al., "Solar Photovoltaic Power Generation," 1980, pp. 217 & 233.
Office Action for U.S. Appl. No. 12/073,437; mailed May 12, 2010.
Apr. 13, 2010 Office Action issued in Chinese Application No. 200710193656.X (with partial translation).
A. V. Shah et al; Thin-film Silicon Solar Cell Technology in Progress in Photovoltaics: Research and Applications Prog. Photovolt: Res. Appl. 2004; 12 pgs. 113-142.
Chinese Office Action of Chinese Application No. 200710185123.7; issued Dec. 18, 2009 (with translation).
Partial Translation of a Japanese Notification of Reasons for Refusal issued on Dec. 8, 2009 for Japanese Application No. 2007-56870; 4pgs.
Office Action for U.S. Appl. No. 12/073,437; mailed Nov. 27, 2009.
Jun. 24, 2010 Office Action issued in Chinese Application No. 200710185124.1 (with partial translation).
Oct. 25, 2010 Office Action issued in U.S. Appl. No. 12/076,916.
Oct. 26, 2010 Office Action issued in U.S. Appl. No. 11/984,182.
Oct. 28, 2010 Office Action issued in U.S. Appl. No. 12/073,437.
Dec. 15, 2010 Japanese Notification of Reasons for Refusal issued in JP-2007-056870 (with Translation).
Dec. 21, 2010 Japanese Outline of a Questioning issued in JP-2006-294490 (with Translation).
Dec. 21, 2010 Japanese Outline of a Questioning issued in JP-2006-294605 (with Translation).
Dec. 21, 2010 Japanese Outline of a Questioning issued in JP-2006-294553 (with Translation).
Dec. 21, 2010 Japanese Outline of a Questioning issued in JP-2006-294608 (with Translation).
Jan. 26, 2011 Office Action issued in Chinese Application No. 2007101851256 (with translation).
May 13, 2011 Extended European Search Report issued in European Application No. 07022106.4.
May 13, 2011 Extended European Search Report issued in European Application No. 07020917.6.
May 13, 2011 Extended European Search Report issued in European Application No. 07020916.8.
May 13, 2011 Extended European Search Report issued in European Application No. 07020918.4.
May 24, 2011 Notification of Reasons for Refusal issued in Japanese Patent Application No. 2006-294553 with partial translation.
May 24, 2011 Notification of Reasons for Refusal issued in Japanese Patent Application No. 2006-294608 with partial translation.
May 24, 2011 Notification of Reasons for Refusal issued in Japanese Patent Application No. 2006-294490 with partial translation.
May 24, 2011 Notification of Reasons for Refusal issued in Japanese Patent Application No. 2006-294605 with partial translation.
Jul. 12, 2011 Office Action issued in U.S. Appl. No. 11/976,020.
Jul. 20, 2011 Office Action issued in U.S. Appl. No. 11/976,026.
Mar. 9, 2011 Office Action issued in Chinese Patent Application No. 200710185124.1 (with partial English-language translation).
Mar. 9, 2011 Office Action issued in Chinese Patent Application No. 200710185123.7 (with partial English-language translation).

* cited by examiner

METHOD FOR PRODUCING SINGLE CRYSTAL SILICON SOLAR CELL AND SINGLE CRYSTAL SILICON SOLAR CELL

BACKGROUND OF THE INVENTION

1. Field of the Invention

The present invention relates to a method for producing a single crystal silicon solar cell and to a single crystal silicon solar cell, and particularly to a method for producing a single crystal silicon solar cell for forming a single crystal silicon layer on a transparent insulator substrate and to a single crystal silicon solar cell having a single crystal silicon layer over a transparent insulator substrate.

2. Description of the Related Art

Solar cells comprising silicon as main materials are classified into single crystal silicon solar cells, polycrystalline silicon solar cells, and amorphous silicon solar cells, based on crystallinities thereof. Among them, single crystal silicon solar cells are each provided as solar cell elements by cutting a single crystal ingot prepared by a crystal pulling method by a wire saw into a wafer shape slice, working the slice into a wafer having a thickness of 100 to 200 µm, and forming p-n junctions, electrodes, a protective film, and the like thereon.

In case of polycrystalline silicon solar cells, there is fabricated a polycrystalline ingot by crystallizing a molten metal silicon in a mold without relying on crystal pulling, and the ingot is cut into a wafer shape slice by a wire saw in the same manner as single crystal silicon solar cells, and the slice is worked into a wafer having a thickness of 100 to 200 µm, and formed with p-n junctions, electrodes, a protective film, and the like thereon, to provide solar cell elements, in the same manner as a single crystal silicon substrate.

In case of amorphous silicon solar cells, there is formed an amorphous silicon hydride film on a substrate by decomposing a silane gas by discharge in a vapor phase such as by a plasma CVD method, and diborane, phosphine, and the like as doping gases are added thereto, followed by simultaneous deposition thereof to simultaneously achieve a p-n junction formation process and a film-formation process, and followed by formation of electrodes and a protective film, thereby providing solar cell elements. In an amorphous silicon solar cell, since amorphous silicon as a direct transition type absorbs incident light, the amorphous silicon has a light absorption coefficient which is about one order higher than those of single crystal silicon and polycrystalline silicon ("Solar photovoltaic power generation", p. 233, by Kiyoshi Takahashi, Yoshihiro Hamakawa, and Akio Ushirokawa, Morikita Shuppan, 1980), thereby providing an advantage that a thickness of about 1 µm of an amorphous silicon layer will do which is about a hundredth of that of a crystal-based solar cell. Thus, expectation is significant for amorphous silicon solar cells capable of effectively utilizing resources, in view of the fact that the annual production volume of solar cells has recently exceeded 1 giga-watts in the world and the production volume will be further increased.

However, it is inappropriate to determine the effective utilization ratio of resources based on simple comparison with a film thickness required by a crystal-based solar cell, because of exemplary circumstances that high purity gas materials such as silane and disilane are used as starting materials for fabrication of amorphous silicon solar cells, and that the effective utilization ratio of the gas materials includes deposition thereof at locations in a plasma CVD apparatus other than at a substrate. Further, an amorphous silicon solar cell has a conversion efficiency of about 10% whereas a crystal-based solar cell has a conversion efficiency of about 15%, and there is still left a problem of degradation of output characteristic in an amorphous silicon solar cell under light irradiation.

As such, there have been conducted various approaches for developing thin-film solar cells by utilizing silicon crystal-based materials ("Solar photovoltaic power generation", p. 217, by Kiyoshi Takahashi, Yoshihiro Hamakawa, and Akio Ushirokawa, Morikita Shuppan, 1980). For example, there is deposited a polycrystalline thin-film on an alumina substrate, graphite substrate, or the like, by using a trichlorosilane gas, a tetrachlorosilane gas, or the like. The thus deposited film has a lot of crystal defects, and the conversion efficiency is low as it is. Thus, it is required to conduct zone melting to improve crystallinity, so as to increase the conversion efficiency (see JP-A-2004-342909, for example). However, even by conducting such a zone melting method, there has been still left an exemplary problem that photocurrent response characteristics in a longer wavelength range are lowered because crystal grain boundaries cause a leak current and shorten lifetimes of carriers.

SUMMARY OF THE INVENTION

The present invention has been carried out in view of the above problem, and it is therefore an object of the present invention to provide a single crystal silicon solar cell and a production method thereof, which single crystal silicon solar cell acts as a silicon solar cell where a light conversion layer is provided as a thin-film for effective utilization of silicon as a starting material of the silicon solar cell, which single crystal silicon solar cell is excellent in conversion characteristics and is less in degradation due to light irradiation, and which single crystal silicon solar cell is provided as a see-through type solar cell that is usable as a natural lighting window material of a house or the like and that transmits part of received visible light therethrough.

To achieve the above object, the present invention provides a method for producing a single crystal silicon solar cell, the solar cell including a transparent insulator substrate and a single crystal silicon layer arranged over the transparent insulator substrate and acting as a light conversion layer, the method comprising at least the steps of:

preparing the transparent insulator substrate and a single crystal silicon substrate having a first conductivity type;

implanting at least one of hydrogen ions and rare gas ions into the single crystal silicon substrate through an ion implanting surface thereof to form an ion implanted layer in the single crystal silicon substrate;

forming a transparent electroconductive film on at least one surface of the transparent insulator substrate;

conducting a surface activating treatment for the ion implanting surface of the single crystal silicon substrate and/or a surface of the transparent electroconductive film on the transparent insulator substrate;

bonding the ion implanting surface of the single crystal silicon substrate and the surface of the transparent electroconductive film on the transparent insulator substrate to each other;

applying an impact to the ion implanted layer to mechanically delaminate the single crystal silicon substrate thereat to leave a single crystal silicon layer;

forming a diffusion layer having a second conductivity type in the single crystal silicon layer, which conductivity type is different from the first conductivity type, in a manner that a p-n junction is formed in the single crystal silicon layer; and forming an electrode on the single crystal silicon layer.

By virtue of the method for producing a single crystal silicon solar cell including such steps, it is possible to produce a single crystal silicon solar cell including a single crystal silicon layer as a light conversion layer arranged over a transparent insulator substrate.

Since the single crystal silicon substrate and the transparent insulator substrate formed with the transparent electroconductive film are bonded to each other after the surface activating treatment, both substrates can be strongly bonded to each other. This results in a sufficiently strong joining, without applying a high-temperature heat treatment for increasing a bonding force. Further, since the joining surfaces are strongly joined to each other in this way, it becomes possible to subsequently apply an impact to the ion implanted layer to thereby mechanically delaminate the single crystal silicon substrate thereat, thereby forming a thin single crystal silicon layer on the transparent insulator substrate. Thus, the single crystal silicon thin-film can be obtained, even without conducting a heat treatment for delamination.

According to the method for producing a single crystal silicon solar cell including such steps, the formation of the single crystal silicon layer acting as the light conversion layer is achieved by the delamination from the single crystal silicon substrate, thereby enabling an enhanced crystallinity of the single crystal silicon layer. This resultingly enables an enhanced conversion efficiency of the solar cell.

Further, the delamination of the single crystal silicon substrate for formation of the single crystal silicon layer is conducted as mechanical delamination without relying on heating, thereby enabling suppression of introduction of cracks, defects, and the like into the light conversion layer due to a difference of thermal expansion coefficient.

Moreover, the solar cell is made to be a thin-film solar cell having the thin layer of silicon, thereby enabling a silicon material to be saved and effectively utilized.

In this case, the surface activating treatment may be at least one of a plasma treatment and an ozone treatment.

In this way, the surface activating treatment is at least one of a plasma treatment and an ozone treatment, thereby enabling the surface activation to be readily conducted so that the single crystal silicon substrate and the transparent electroconductive film on the transparent insulator substrate are strongly bonded to each other.

Further, the transparent insulator substrate may be made of any one of quartz glass, crystallized glass, borosilicate glass, and soda-lime glass.

In this way, the transparent insulator substrate is made of any one of quartz glass, crystallized glass, borosilicate glass, and soda-lime glass which are each a transparent insulator substrate having excellent optical characteristics, thereby enabling a see-through type single crystal silicon solar cell to be readily produced. It becomes further possible to readily substitute the thus produced single crystal silicon solar cell for an existing window glass or the like.

Further, the transparent electroconductive film is desirably configured to contain at least one of titanium oxide, zinc oxide, tin oxide, and indium oxide, and a donor-forming additive.

In this way, the transparent electroconductive film is configured to contain at least one of titanium oxide, zinc oxide, tin oxide, and indium oxide, and a donor-forming additive, thereby enabling obtainment of a transparent electroconductive film having a lower sheet resistance and a higher transmittance near visible light which is conversion light of the single crystal silicon solar cell.

Further, the formation of the transparent electroconductive film is desirably conducted by at least one of a reactive sputtering method, a reactive vapor deposition method, a CVD method, and a dip coating method.

In this way, the formation of the transparent electroconductive film is conducted by at least one of a reactive sputtering method, a reactive vapor deposition method, a CVD method (chemical vapor deposition method), and a dip coating method, thereby enabling the transparent electroconductive film to be assuredly and readily formed.

Furthermore, the ion implantation is preferably conducted at a depth between 0.1 μm inclusive and 5 μm inclusive from the ion implanting surface.

In this way, the ion implantation is conducted at a depth between 0.1 μm inclusive and 5 μm inclusive from the ion implanting surface, thereby enabling achievement of a thickness between 0.1 μm inclusive and 5 μm inclusive for the single crystal silicon layer as the light conversion layer of the single crystal silicon solar cell to be produced. The single crystal silicon solar cell having the single crystal silicon layer of such a thickness is allowed to obtain a practical efficiency as a thin-film single crystal silicon solar cell and to save an amount of silicon material to be used. Further, the single crystal silicon solar cell having the single crystal silicon layer of such a thickness is capable of assuredly transmitting part of visible light therethrough.

The present invention further provides a single crystal silicon solar cell produced by any one of the methods for producing a single crystal silicon solar cell, comprising:

at least, a transparent insulator substrate, a transparent electroconductive film, a single crystal silicon layer in which a p-n junction is formed, and an electrode, which are successively laminated.

In this way, in the single crystal silicon solar cell produced by any one of the methods for producing a single crystal silicon solar cell, comprising: at least, a transparent insulator substrate, a transparent electroconductive film, a single crystal silicon layer in which a p-n junction is formed, and an electrode, which are successively laminated, the formation of the single crystal silicon layer acting as the light conversion layer is achieved by the delamination from the single crystal silicon substrate, and the delamination of the single crystal silicon layer is conducted by mechanical delamination without relying on heating, thereby enabling provision of a single crystal silicon layer having an enhanced crystallinity. This allows the solar cell to be a thin-film solar cell having a higher conversion efficiency as compared to the film thickness. Further, the thin-film solar cell including the thin single crystal silicon layer allows for effective utilization of a silicon material.

In this case, the single crystal silicon solar cells can be desirably seen through from one surface side toward the other surface side.

In this way, the single crystal silicon solar cell can be seen through from one surface side toward the other surface side, so that the solar cell can be applied to various situations such that the solar cell can be substituted for an existing window glass or the like.

According to the method for producing a single crystal silicon solar cell of the present invention, it is possible to produce a see-through type thin-film solar cell which is excellent in crystallinity and has a single crystal silicon layer having a higher conversion efficiency as a light conversion layer.

Moreover, the single crystal silicon solar cell according to the present invention acts as a silicon solar cell including a light conversion layer arranged over a transparent insulator substrate in which the light conversion layer is made of a single crystal silicon layer, thereby allowing the solar cell to have a higher conversion efficiency as compared to the film thickness of the light conversion layer.

DETAILED DESCRIPTION OF THE PREFERRED EMBODIMENTS

Figure 1:
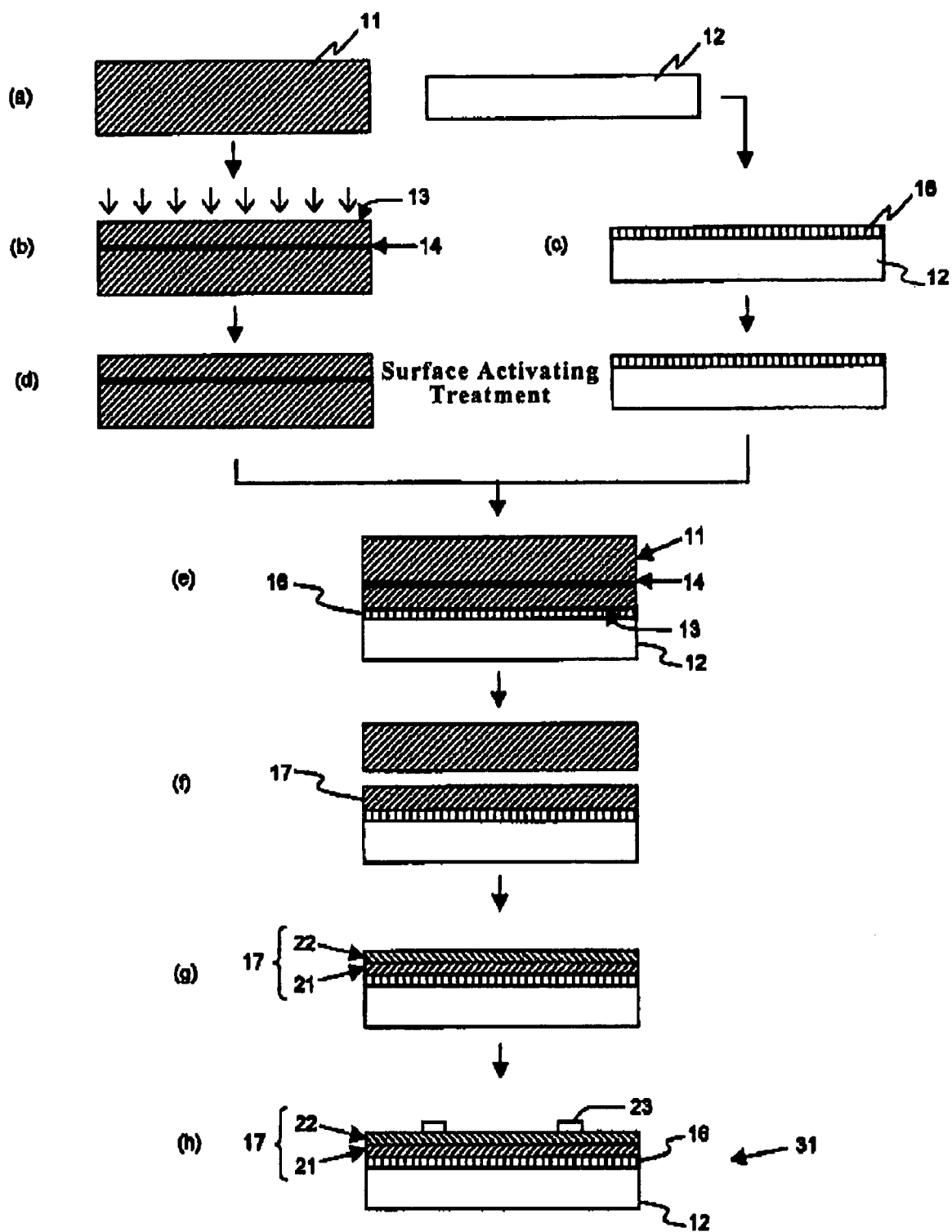
FIG. 1 is a process diagram of an example of a method for producing a single crystal silicon solar cell according to the present invention.

As described above, there has been demanded a higher conversion efficiency even in a thin-film solar cell capable of saving a silicon material, and as such, it has been demanded to further improve crystallinity in addition to adoption of a crystal-based solar cell.

Under such circumstances, the present inventors have found out that crystallinity of a silicon layer as a light conversion layer can be enhanced, by previously forming a transparent electroconductive film acting as an electrode on a transparent insulator substrate, and by obtaining a single crystal silicon thin-film from a single crystal silicon substrate after once bonding the single crystal silicon substrate and the transparent electroconductive film on the transparent insulator substrate to each other. Further, the present inventors have conceived that crystallinity of the single crystal silicon layer can be satisfactorily maintained, by activating surfaces of the single crystal silicon substrate and the transparent electroconductive film on the transparent insulator substrate before bonding them to each other to thereby increase a bonding strength therebetween without a high-temperature heat treatment, and by conducting mechanical delamination upon delaminating the single crystal silicon substrate without conducting a high-temperature heat treatment. Furthermore, the present inventors have conceived that such a thin-film solar cell is allowed to act as a so-called see-through type solar cell which can be seen through from one surface side toward the other surface side and which is also usable as a window material of a house, thereby completing the present invention.

Although the embodiment of the present invention will be concretely described, the present invention is not limited thereto.

FIG. 1 is a process diagram of an example of a method for producing a single crystal silicon solar cell according to the present invention.

Firstly, there are prepared a single crystal silicon substrate 11 and a transparent insulator substrate 12 (stage "a").

The single crystal silicon substrate is not limited to a particular one, and it is possible to adopt a single crystal silicon substrate which is obtained by slicing a single crystal exemplarily grown by a Czochralski method, and which is 100 to 300 mm in diameter, p-type or n-type in conductivity type, and about 0.1 to 20 Ω·cm in specific resistance, for example.

Further, selected as the transparent insulator substrate is quartz glass, crystallized glass, borosilicate glass, soda-lime glass, or the like. Although selectable glasses are not limited thereto, such glass materials are desirable in view of the fact that they are transparent and are each capable of alternatively acting as a window glass material. Further, in case of adopting a glass material made of general-purpose soda-lime glass as the transparent insulator substrate, it is possible to adopt one having a surface formed with a silicon oxide coating, tin oxide coating (Nesa film), or the like by a dip coating method. Such a coating is desirable because it acts as a buffer film for preventing elution and diffusion of an alkali metal component in the soda-lime glass to the surface of the glass.

Next, at least one of hydrogen ions and rare gas ions is implanted into the single crystal silicon substrate 11, to form an ion implanted layer 14 therein (stage "b").

For example, the temperature of the single crystal silicon substrate is brought to 200 to 450° C., and at least one of hydrogen ions and rare gas ions at a predetermined dosage is implanted into the single crystal silicon substrate at such an implantation energy capable of forming an ion implanted layer 14 at that depth from a surface 13 of the single crystal silicon substrate which corresponds to a desired thickness of a single crystal silicon layer such as a depth of 0.1 to 5 μm or less. In this case, hydrogen ions are particularly desirable, since they are light-weighted and thus can be implanted into a larger depth from the ion implanting surface 13 by the same acceleration energy. The hydrogen ions may be either positive or negative in charge, and may be hydrogen gas ions in addition to hydrogen atom ions. Also in case of rare gas ions, charge thereof may be either positive or negative.

Further, there can be obtained an effect for suppressing channelling of implanted ions, by previously forming an insulator film such as a thin silicon oxide film at a surface of the single crystal silicon substrate, and by achieving ion implantation through the insulator film. Note that when a thick insulator film has been formed, it is required to remove it by etching or the like before a surface activating stage "d".

Meanwhile, there is formed a transparent electroconductive film 16 on the transparent insulator substrate 12 (stage "c").

Examples of the transparent electroconductive film include those transparent electroconductive materials which each contain titanium oxide, zinc oxide, tin oxide, indium oxide, or the like, and a donor-forming additive for enhancing electroconductive of the material. Concerning the donor-forming additive, it is typical to add tin into indium oxide to turn it into indium tin oxide (tin-added indium oxide; ITO), as well as to add fluorine, antimony, or the like into tin oxide, to add gallium, aluminum, or the like into zinc oxide, and the donor-forming additive can be appropriately designed without limited thereto. The transparent electroconductive film to be used is not limited to them, and is to preferably have a sheet resistance of 100 Ω/sq. or lower, and has a transmittance of visible light of 80% or more.

Although formation of the transparent electroconductive film can be conducted by using a vacuum deposition apparatus for conversion sputtering, conversion vapor deposition, it is possible to adopt a CVD method (chemical vapor deposition method), dip coating, or the like. Upon formation of the transparent electroconductive film, it is desirable to sufficiently flatten the surface thereof, so as to enhance a bonding strength thereof at the bonding stage "e" to be described later. Such a surface having higher flatness can be exemplarily realized by once depositing the transparent electroconductive film and then flattening the surface thereof by polishing or the like.

Note that the stage "b" for conducting ion implantation into the single crystal silicon substrate and the stage "c" for forming the transparent electroconductive film on the surface of the transparent insulator substrate, may be conducted in an arbitrary order.

Next, there is conducted a surface activating treatment for the ion implanting surface 13 of the single crystal silicon substrate 11 and/or the transparent electroconductive film 16 on the transparent insulator substrate 12 (stage "d").

This surface activating treatment is not particularly limited insofar as allowing the single crystal silicon substrate 11 and the transparent electroconductive film 16 on the transparent insulator substrate 12 to be strongly bonded to each other at the next bonding stage "e", and the treatment can be preferably conducted by at least one of plasma treatment and ozone treatment.

In case of treatment by plasma, the single crystal silicon substrate 11 and/or the transparent insulator substrate 12 formed thereon with the transparent electroconductive film 16 having been subjected to cleaning such as RCA cleaning is/are placed in a vacuum chamber, and a gas for plasma is introduced thereinto, followed by exposure to a radio-frequency plasma at about 100 W for about 5 to 10 seconds, thereby plasma treating at least those surfaces to be subjected to the surface activating treatment, i.e., the ion implanting surface 13 of the single crystal silicon substrate 11, and the surface of the transparent electroconductive film 16 on the transparent insulator substrate 12. The gas for plasma is not particularly limited, and it is possible to use a hydrogen gas, an argon gas, a mixed gas of them, or a mixed gas of hydrogen gas and helium gas.

In case of treatment by ozone, the single crystal silicon substrate 11 and/or the transparent insulator substrate 12 formed thereon with the transparent electroconductive film 16 having been subjected to cleaning such as RCA cleaning is/are placed in a chamber including the atmospheric air introduced therein, and a gas for plasma such as a nitrogen gas or an argon gas is introduced thereinto, followed by generation of radio-frequency plasma to convert oxygen in the atmospheric air into ozone, thereby ozone treating at least the surface(s) to be subjected to the surface activating treatment. It is possible to conduct one or both of the plasma treatment and ozone treatment.

The surface activating treatment such as plasma treatment or ozone treatment oxidizes and removes organic substances on the surface(s) of the single crystal silicon substrate 11 and/or the transparent electroconductive film 16 on the transparent insulator substrate 12, and increases the number of OH groups at the surface(s), thereby activating the surface(s). Although the surface activating treatment is to be desirably conducted for both the surfaces of the single crystal silicon substrate 11 and the transparent electroconductive film 16 on the transparent insulator substrate 12, it is possible to conduct the treatment for only one of the surfaces.

Next, the ion implanting surface 13 of the single crystal silicon substrate 11 and the surface of the transparent electroconductive film 16 on the transparent insulator substrate 12 are bonded to each other (stage "e").

Since at least one of the ion implanting surface 13 of the single crystal silicon substrate and the surface of the transparent electroconductive film 16 on the transparent insulator substrate 12 has been subjected to the surface activating treatment in the stage "d", the substrate and electroconductive film can be strongly joined to each other at a strength capable of withstanding mechanical delamination in the later stage, by merely and closely contacting the substrate and electroconductive film with each other at a temperature ranging from a room temperature to about 250° C., desirably at about the room temperature, under a reduced pressure or ordinary pressure.

The bonding stage is to be conducted under a temperature condition between a room temperature and about 250° C., without conducting a heat treatment at 300° C. or higher. This is because, when a high-temperature heat treatment at 300° C. or higher is conducted in a state that the single crystal silicon substrate 11 and the transparent electroconductive film 16 on the transparent insulator substrate 12 are bonded to each other, there is a possibility of occurrence of heat distortion, cracks, debonding, and the like, due to a difference between thermal expansion coefficients of the substrate and electroconductive film. In this way, avoidance of a high-temperature heat treatment at 300° C. or higher is also applicable, until completion of delaminative transference from the single crystal silicon substrate 11 in the stage "f" to be described later.

Next, there is applied an impact to the ion implanted layer 14 to mechanically delaminate the single crystal silicon substrate 11 thereat to leave a single crystal silicon layer 17 (stage "f").

In the present invention, since the mechanical delamination is conducted by applying an impact to the ion implanted layer, there is no possibility of occurrence of heat distortion, cracks, debonding, and the like due to heating. Although it is enough that a jet of fluid such as gas, liquid, or the like is continuously or intermittently blown onto the joined wafer from the side thereof so as to apply an impact to the ion implanted layer, the impacting method is not particularly limited insofar as capable of causing mechanical delamination by impact.

Note that it is desirable to conduct delamination of the single crystal silicon substrate upon mechanical delamination thereof, by closely contacting a first auxiliary substrate with the back surface of the transparent insulator substrate and closely contacting a second auxiliary substrate with the back surface of the single crystal silicon substrate. Conducting the mechanical delamination by using such auxiliary substrates, prevents occurrence of small cracks due to warpage and crystal defects due to such cracks in the delaminatedly transferred single crystal silicon layer 17, thereby enabling prevention of degradation of a conversion efficiency of a solar cell. This method exhibits a remarkable effect, in case that each substrate has a small thickness such as about 1 mm or less. For example, when the transparent insulator substrate is made of soda-lime glass and has a thickness of 0.7 mm, delamination is conducted by adopting an auxiliary substrate similarly made of soda-lime glass and by establishing a total thickness of 1 mm or more for both substrates.

Further, it is possible to conduct a heat treatment after conducting the delaminative transference from the single crystal silicon substrate, so as to heal ion implantation damages near the surface of the single crystal silicon layer 17. Since the delaminative transference from the single crystal silicon substrate 11 has been already completed at this time to leave the thin-film single crystal silicon layer 17, cracks and defects accompanying thereto are hardly caused in the single crystal silicon layer even by conduction of a local heat treatment at 300° C. or higher near the surface of the single crystal silicon layer. This is also applicable to the following stages.

Next, there is formed a diffusion layer having a second conductivity type on the single crystal silicon layer 17, which conductivity type is different from a first conductivity type of the single crystal silicon substrate prepared in the stage "a", thereby causing the single crystal silicon layer to comprise a silicon layer 21 having a first conductivity type and a silicon layer 22 having a second conductivity type so that a p-n junction is formed (stage "g").

The diffusion layer as formed is of n-type when the single crystal silicon substrate 11 prepared in the stage "a" is p-type single crystal silicon, and is of p-type when the single crystal silicon substrate is n-type single crystal silicon. It is possible to adopt a method for forming the diffusion layer having the second conductivity type, as follows. When the single crystal silicon substrate 11 prepared in the stage "a" is of p-type, element ions of phosphorus are implanted into the surface of the single crystal silicon layer 17 by an ion implantation method, and there is conducted an activating treatment for donors at the implanted surface by performing: flash-lamp annealing; laser irradiation of ultraviolet light or deep ultraviolet light having a higher absorption coefficient at the surface of the single crystal silicon layer; or the like; thereby enabling formation of a p-n junction. Such a formation of the p-n junction may be conducted in a manner: to prepare a paste-like composite containing phosphorus for forming donors; to coat the composite onto the surface of the single crystal silicon layer 17; and to conduct a diffusion treatment for the coated composite by, flash-lamp annealing, laser irradiation of ultraviolet light or deep ultraviolet light having a higher absorption coefficient at the surface of the single crystal silicon layer, an infrared furnace, or the like.

Note that it is possible to exemplarily conduct polishing called "touch polish" with an extremely small polishing amount of 5 to 400 nm, after forming the p-n junction in the above-described manner.

Next, electrodes 23 are formed on the surface of the single crystal silicon layer 17 at the side of the silicon layer 22 having the second conductivity type (stage "h"). The electrodes 23 act as counter electrodes to the transparent electroconductive film 16.

Namely, the electrodes 23 as counter electrodes to the transparent electroconductive film 16 acting as an electrode are formed in a manner that electrodes each in a linear shape or the like are formed on the diffusion treated surface by a vacuum deposition method, chemical sputtering method, or the like while adopting a metal or transparent electroconductive material. It is also possible to form a collector electrode by printing while adopting an electroconductive paste including metal. Curing of the composite for forming the collector electrode is conducted by the above-described flash-lamp annealing, infrared heating, or the like. In case of forming electrodes of metal in order that the single crystal silicon solar cell according to the present invention has a structure that the solar cell can be assuredly seen through from one surface side toward the other surface side, the electrodes are to preferably have a surface area of 80% or less, more preferably 50% or less of the whole of light receiving surface. In case of forming a transparent electroconductive film, it can be formed over the whole surface. Further, the collector electrode may be formed at the end portion of the transparent insulator substrate.

It is also possible to form a protective film or the like made of silicon nitride or the like, after forming the electrodes 23.

The single crystal silicon solar cell produced by the stages "a" through "h" is a single crystal silicon solar cell 31, which is free of occurrence of heat distortion, debonding, cracks, and the like upon production, which is thin and has an excellent uniformity of film thickness, which is excellent in crystallinity, and which has a single crystal silicon layer on a transparent insulator substrate.

Note that the remaining single crystal silicon substrate after delaminative transference of the single crystal silicon layer 17 therefrom in the stage "f", can be again utilized as a single crystal silicon substrate 11, by conducting a treatment of polishing, smoothing, and removing the rough surface and the ion implanted layer after delamination, and by conducting an ion implantation treatment repeatedly. Since it is unnecessary in the method for producing a single crystal silicon solar cell of the present invention to heat the single crystal silicon substrate to a temperature of 300° C. or higher throughout the ion implantation stage to the delamination stage, there is no possibility that defects induced by oxygen are introduced into the single crystal silicon substrate. As such, it becomes possible to conduct delaminative transference as many as 100 or more times, in case of firstly adopting a single crystal silicon substrate having a thickness slightly less than 1 mm and setting the film thickness of a single crystal silicon layer 17 to be 5 μm.

As shown in FIG. 1(h), the single crystal silicon solar cell 31 produced by such a production method is configured such that: the transparent insulator substrate 12, the transparent electroconductive film 16, the single crystal silicon layer 17 in which the p-n junction is formed, and the electrode 23 are successively laminated. The single crystal silicon solar cell 31 is configured to convert incident light into electric power at the single crystal silicon layer 17 (light conversion layer) in which the p-n junction is formed, and to extract the electric power by setting the transparent electroconductive film 16 and the electrode(s) 23 as appropriate ones of positive electrode and negative electrode, respectively.

When the single crystal silicon layer 17 has a thickness between 0.1 μm and 5 μm, it is possible to obtain a practical efficiency as a thin-film single crystal silicon solar cell and to sufficiently save an amount of silicon material to be used. Further, the single crystal silicon solar cell having such a thickness of single crystal silicon layer is assuredly capable of transmitting part of visible light therethrough and thus becoming transparent.

Further, the single crystal silicon solar cell 31 according to the present invention can be seen through from one surface side toward the other surface side, and it is possible in this case to adopt either of the transparent insulator substrate 12 side or the electrode 23 side, as a light receiving surface.

EXAMPLE

Prepared as a single crystal silicon substrate 11 was a single crystal silicon substrate of a p-type, having a diameter of 200 mm (8 inches), one surface which was mirror-polished, a crystal face (100), and a specific resistance of 15 Ω·cm. Further prepared as a transparent insulator substrate 12 was a quartz glass substrate having a diameter of 200 mm (8 inches) and a thickness of 2.5 mm (stage "a").

Next, hydrogen cations were implanted into the single crystal silicon substrate 11 under a condition of an acceleration voltage of 350 keV and a dosage of $1.0 \times 10^{17}/cm^2$ (stage "b"). This resulted in a depth of an ion implanted layer 14 at about 3 μm from an ion implanting surface 13.

Meanwhile, there was formed a coating of tin oxide doped with fluorine at a thickness of about 0.5 μm on one surface of the quartz glass substrate 12 by chemical vapor deposition, thereby providing a transparent electroconductive film 16 (stage "c"). The surface of the transparent electroconductive film was polished by a CMP method in a manner to obtain a mirror surface having an averaged roughness of 0.3 nm or less in 10 μm×10 μm scanning by an atomic force microscope (AFM). The fluorine-doped tin oxide coating after polishing had a thickness of 0.4 μm and a sheet resistance of 15 Ω/sq.

Next, there was conducted a surface activating treatment for the ion implanting surface 13 of the single crystal silicon substrate 11 and the fluorine-doped tin oxide coating 16 on the polished surface of the quartz glass substrate 12, by a reduced pressure plasma method for exposing the surfaces to nitrogen plasma for 15 seconds (stage "d").

Subsequently, the single crystal silicon substrate 11 and the fluorine-doped tin oxide coating 16 on the quartz glass substrate 12 were strongly bonded to each other, by using the surfaces subjected to the surface activating treatment as bonding surfaces, respectively (stage "e").

Next, there was blown a high pressure nitrogen gas onto the vicinity of the joining interface, followed by conduction of mechanical delamination for delaminating the single crystal silicon substrate in a manner to initiate the delamination from the blown surface (stage "f"). At this time, the delamination was conducted after suckingly attaching auxiliary substrates from the back to the single crystal silicon substrate and quartz glass substrate, respectively. Further, irradiation was conducted onto the delaminatedly transferred single crystal silicon by flash-lamp annealing under a condition that the surface of the single crystal silicon was momentarily brought to a temperature of 700° C. or higher, thereby healing hydrogen implantation damages.

Next, coated onto the whole surface of the single crystal silicon layer 17 was a diffusion paste containing ethyl cellosolve including phosphosilicate glass as a thickener, by screen printing. Irradiation was conducted thereto by a flash lamp such that the surface was momentarily heated to 600° C. or higher, thereby forming a p-n junction interface at a joining depth of about 1 μm (stage "g").

This diffusion paste was subjected to removal and cleaning by hydrofluoric acid, acetone, and isopropyl alcohol, followed by formation of silver electrodes 23 by vacuum deposition and patterning (stage "h"). Subsequently, there was formed a collector electrode pattern of silver by a vacuum deposition method while adopting a metal mask. There was then formed a protective coating of silicon nitride over the surface by conversion sputtering, except for portions of pickup electrodes.

In this way, there was produced a thin-film single crystal silicon solar cell 31 including: the transparent insulator substrate; the transparent electroconductive film; the single crystal silicon layer in which the p-n junction is formed; and the electrodes; in a successively laminated manner.

Irradiated to the thus produced single crystal silicon solar cell was a light of 100 mW/cm$^2$ under AM1.5 conditions by a solar simulator, thereby measuring a conversion efficiency. The conversion efficiency was 9%, and timewise change was not observed.

Further, it was possible to see a situation in a room by looking thereinto through the solar cell while allowing outside light to enter the room therethrough during a fine day.

Note that the present invention is not limited to the above embodiment. The embodiment is merely exemplary, and whatever has substantially the same configuration and exhibit the same functions and effects as the technical concept recited in the appended claims of the present application shall be embraced within the technical concept of the present invention.

The invention claimed is:

1. A method for producing a single crystal silicon solar cell, the solar cell including a transparent insulator substrate and a single crystal silicon layer arranged over the transparent insulator substrate and acting as a light conversion layer, the method comprising at least the steps of:
preparing the transparent insulator substrate and a single crystal silicon substrate having a first conductivity type;
implanting at least one of hydrogen ions and rare gas ions into the single crystal silicon substrate through an ion implanting surface thereof to form an ion implanted layer in the single crystal silicon substrate;
forming a transparent electroconductive film on at least one surface of the transparent insulator substrate;
conducting a surface activating treatment for the ion implanting surface of the single crystal silicon substrate and/or a surface of the transparent electroconductive film on the transparent insulator substrate;
bonding the ion implanting surface of the single crystal silicon substrate and the surface of the transparent electroconductive film on the transparent insulator substrate to each other;
applying an impact to the ion implanted layer to mechanically delaminate the single crystal silicon substrate thereat to leave a single crystal silicon layer;
forming a diffusion layer having a second conductivity type in the single crystal silicon layer, which conductivity type is different from the first conductivity type, in a manner that a p-n junction is formed in the single crystal silicon layer; and
forming an electrode on the single crystal silicon layer.

2. The method for producing a single crystal silicon solar cell according to claim 1, wherein the surface activating treatment is at least one of a plasma treatment and an ozone treatment.

3. The method for producing a single crystal silicon solar cell according to claim 1, wherein the transparent insulator substrate is made of any one of quartz glass, crystallized glass, borosilicate glass, and soda-lime glass.

4. The method for producing a single crystal silicon solar cell according to claim 2, wherein the transparent insulator substrate is made of any one of quartz glass, crystallized glass, borosilicate glass, and soda-lime glass.

5. The method for producing a single crystal silicon solar cell according to claim 1, wherein the transparent electroconductive film is configured to contain at least one of titanium oxide, zinc oxide, tin oxide, and indium oxide, and a donor-forming additive.

6. The method for producing a single crystal silicon solar cell according to claim 2, wherein the transparent electroconductive film is configured to contain at least one of titanium oxide, zinc oxide, tin oxide, and indium oxide, and a donor-forming additive.

7. The method for producing a single crystal silicon solar cell according to claim 3, wherein the transparent electroconductive film is configured to contain at least one of titanium oxide, zinc oxide, tin oxide, and indium oxide, and a donor-forming additive.

8. The method for producing a single crystal silicon solar cell according to claim 4, wherein the transparent electroconductive film is configured to contain at least one of titanium oxide, zinc oxide, tin oxide, and indium oxide, and a donor-forming additive.

9. The method for producing a single crystal silicon solar cell according to claim 1, wherein the formation of the transparent electroconductive film is conducted by at least one of a reactive sputtering method, a reactive vapor deposition method, a CVD method, and a dip coating method.

10. The method for producing a single crystal silicon solar cell according to claim 2, wherein the formation of the transparent electroconductive film is conducted by at least one of a reactive sputtering method, a reactive vapor deposition method, a CVD method, and a dip coating method.

11. The method for producing a single crystal silicon solar cell according to claim 3, wherein the formation of the transparent electroconductive film is conducted by at least one of a reactive sputtering method, a reactive vapor deposition method, a CVD method, and a dip coating method.

12. The method for producing a single crystal silicon solar cell according to claim 4, wherein the formation of the transparent electroconductive film is conducted by at least one of a reactive sputtering method, a reactive vapor deposition method, a CVD method, and a dip coating method.

13. The method for producing a single crystal silicon solar cell according to claim 5, wherein the formation of the transparent electroconductive film is conducted by at least one of a reactive sputtering method, a reactive vapor deposition method, a CVD method, and a dip coating method.

14. The method for producing a single crystal silicon solar cell according to claim 6, wherein the formation of the transparent electroconductive film is conducted by at least one of a reactive sputtering method, a reactive vapor deposition method, a CVD method, and a dip coating method.

15. The method for producing a single crystal silicon solar cell according to claim 7, wherein the formation of the transparent electroconductive film is conducted by at least one of a reactive sputtering method, a reactive vapor deposition method, a CVD method, and a dip coating method.

16. The method for producing a single crystal silicon solar cell according to claim 8, wherein the formation of the transparent electroconductive film is conducted by at least one of a reactive sputtering method, a reactive vapor deposition method, a CVD method, and, a dip coating method.

17. The method for producing a single crystal silicon solar cell according to claim 1, wherein the ion implantation is conducted at a depth between 0.1 μm inclusive and 5 μm inclusive from the ion implanting surface.

18. The method for producing a single crystal silicon solar cell according to claim 16, wherein the ion implantation is conducted at a depth between 0.1 μm inclusive and 5 μm inclusive from the ion implanting surface.

\* \* \* \* \*